United States Patent
Kim et al.

(10) Patent No.: US 7,492,635 B2
(45) Date of Patent: Feb. 17, 2009

(54) NOR-TYPE HYBRID MULTI-BIT NON-VOLATILE MEMORY DEVICE AND METHOD OF OPERATING THE SAME

(75) Inventors: Won-joo Kim, Suwon-si (KR); Yoon-dong Park, Yongin-si (KR)

(73) Assignee: Samsung Electronics Co., Ltd., Cyeemggi-do (KR)

(*) Notice: Subject to any disclaimer, the term of this patent is extended or adjusted under 35 U.S.C. 154(b) by 192 days.

(21) Appl. No.: 11/371,941

(22) Filed: Mar. 10, 2006

(65) Prior Publication Data

US 2006/0152961 A1 Jul. 13, 2006

Related U.S. Application Data

(63) Continuation-in-part of application No. 11/325,599, filed on Jan. 5, 2006.

(30) Foreign Application Priority Data

Jan. 6, 2005 (KR) .................. 10-2005-0001141
Mar. 12, 2005 (KR) .................. 10-2005-0020798

(51) Int. Cl.
*G11C 11/34* (2006.01)
*G11C 11/00* (2006.01)
*G11C 16/04* (2006.01)

(52) U.S. Cl. .................. 365/185.17; 365/158; 365/163; 365/148

(58) Field of Classification Search ............... 257/314, 257/315, 316, E29.272, E29.275; 365/148, 365/158, 163, 185.17
See application file for complete search history.

(56) References Cited

U.S. PATENT DOCUMENTS

| 5,784,325 A | * | 7/1998 | Arase et al. | 365/185.18 |
| 6,069,381 A | * | 5/2000 | Black et al. | 257/316 |
| 6,225,168 B1 | * | 5/2001 | Gardner et al. | 438/287 |
| 6,490,194 B2 | * | 12/2002 | Hoenigschmid | 365/171 |
| 7,276,758 B2 | * | 10/2007 | Kim | 257/315 |

FOREIGN PATENT DOCUMENTS

JP 2005-005569 1/2005

OTHER PUBLICATIONS

Office Action for corresponding Korean Application No. 10-2005-0001141 dated Jul. 5, 2006 and English translation thereof.

* cited by examiner

*Primary Examiner*—Richard Elms
*Assistant Examiner*—Douglas King
(74) *Attorney, Agent, or Firm*—Harness Dickey & Pierce

(57) ABSTRACT

A hybrid multi-bit memory device may include a plurality of unit cells arranged in a matrix of a plurality of rows and columns. Each of the unit cells may include a first memory unit and a second memory unit. The first and second memory unit may share a source and a drain. The first memory unit of each unit cell arranged in each row may be connected to one of a plurality of word lines, and the drain of each unit cell arranged in each column may be connected to one of a plurality of bit lines.

23 Claims, 5 Drawing Sheets

NOR-TYPE HYBRID MULTI-BIT NON-VOLATILE MEMORY DEVICE AND METHOD OF OPERATING THE SAME

PRIORITY STATEMENT

This non-provisional patent application is a continuation-in-part of, and claims priority under 35 U.S.C § 120 to U.S. non-provisional patent application 11/325,599, filed on Jan. 5, 2006, which further claims priority under 35 U.S.C § 119 to Korean Patent Application No. 10-2005-0001141, filed on Jan. 6, 2005, in the Korean Intellectual Property Office (KIPO), the entire contents of both of which are incorporated herein by reference. This non-provisional patent application further claims priority under 35 U.S.C § 119 to Korean Patent Application No. 10-2005-0020798, filed on Mar. 12, 2005, in the Korean Intellectual Property Office (KIPO), the entire contents of which is incorporated herein by reference.

FIELD OF THE INVENTION

Example embodiments of the present invention are directed to semiconductor memory devices, for example, multi-bit non-volatile memory (NVM) devices and methods of operating the same.

DESCRIPTION OF THE RELATED ART

With increasing demand for mobile phones and/or digital cameras, comes demand for NVM devices. NVM devices may process data quicker and/or store data even after power has been shut-off as compared to DRAM conventionally used in computers.

NVM devices may be one of threshold voltage transition devices, charge displacement devices or resistance varying devices. Depending on the type of a storage node, threshold voltage transition devices may be flash memory devices with a floating gate or SONOS devices with a charge trapping layer. Charge displacement devices may be nano-crystal ferroelectric RAM (FRAM) devices or polymer devices. Resistance varying devices may be magnetic RAM (MRAM) devices, phase change RAM (PRAM) devices, resistance RAM (RRAM) using a compound metal oxide or polymer memory devices. Related art NVM devices may not increase memory integrity and/or speed because processing technology for fabricating a fine pattern may be limited.

SUMMARY OF THE INVENTION

Example embodiments of the present invention provide memory devices (e.g., NOR-type hybrid multi-bit non-volatile memory devices) having unit cells with a hybrid structure, and methods for the same. The hybrid structure may include at least two structures having different operating systems (e.g., different memory storage systems).

According to an example embodiment of the present invention, a memory device may have a NOR cell array structure in which unit cells may be arranged in a matrix of a plurality of rows and columns. Each unit cell may include a channel, a first memory unit, a second memory unit and a switch. The first memory node may include a first storage node capable of storing charges, and may read data according to variations or changes in a threshold voltage of the channel. The variations in the threshold voltage of the channel may be based on whether the charges are stored in the first storage node. The second memory unit may include a second storage node having a resistance characteristic that vary according to an applied voltage. The switch may be connected to the second storage node, and the first memory unit and the second memory unit may share a source and a drain. The first memory unit of each unit cell arranged on in each row may be commonly connected to one of a plurality of word lines, and the drain of each unit cells arranged in each column may be commonly connected to one of a plurality of bit lines.

According to another example embodiment of the present invention, a memory device may have a NOR cell array structure in which unit cells may be arranged in a matrix of a plurality of rows and columns. Each unit cell may include a channel formed on a semiconductor substrate. A source and a drain may be formed adjacent to respective ends of the channel. A first insulating layer may be formed on the channel, and a first storage node may be formed on the first insulating layer. The first storage node may be a charge storage medium. A second insulating layer may be formed on the first storage node, and a control gate electrode may be formed on the second insulating layer. A third insulating layer may be formed on the control gate electrode, and a second storage node may be formed on the third insulating layer; the second storage node may be a variable resistance medium. A switch may connect the second storage node to one of the source and the drain, the control gate electrode of each unit cell in each row may be commonly connected to one of a plurality of word lines, and the drains of each unit cell arranged in each column may be commonly connected to a bit line.

In example embodiments of the present invention, the first storage node may include poly silicon, silicon nitride, a silicon dot or a metal dot. The second storage node may be a variable resistance storage material having resistance characteristics that vary according to an applied voltage. For example, the second storage node may be comprised of $Nb_2O_5$, Cr doped $SrTiO_3$, $ZrO_x$, $GST(GeSb_xTe_y)$, NiO, $TiO_2$ or HfO. The switch may include $V_2O_5$, TiO or any other material that is electrically conductive only when a voltage greater than a critical voltage is applied.

According to another example embodiment of the present invention, a unit cell may be selected by selecting one of the word lines and one of the bit lines. The first memory unit may be controlled by controlling a first voltage applied to the word line connected to the selected unit cell and inducing current to flow through the channel of the first memory unit. The second memory unit may be controlled by controlling a second voltage applied to the bit line connected to the selected unit cell and inducing current to flow through the switch of the second memory unit.

The write operation for the first memory unit may include preventing current flow through the switch by reducing the second voltage to a value less than a critical voltage, setting the first voltage to a write voltage and storing charge in the first storage node.

The write operation for the second memory unit may be performed by preventing current flow through the channel by reducing the first voltage to a value less than a threshold voltage, allowing the current to flow through the switch by setting the second voltage to a write voltage greater than the critical voltage, and inducing resistance variation of the second storage node.

BRIEF DESCRIPTION OF THE DRAWINGS

The present invention will become more apparent by describing in detail the example embodiments shown in the attached drawings in which.

DETAILED DESCRIPTION OF EXAMPLE EMBODIMENTS OF THE PRESENT INVENTION

Figure 1:
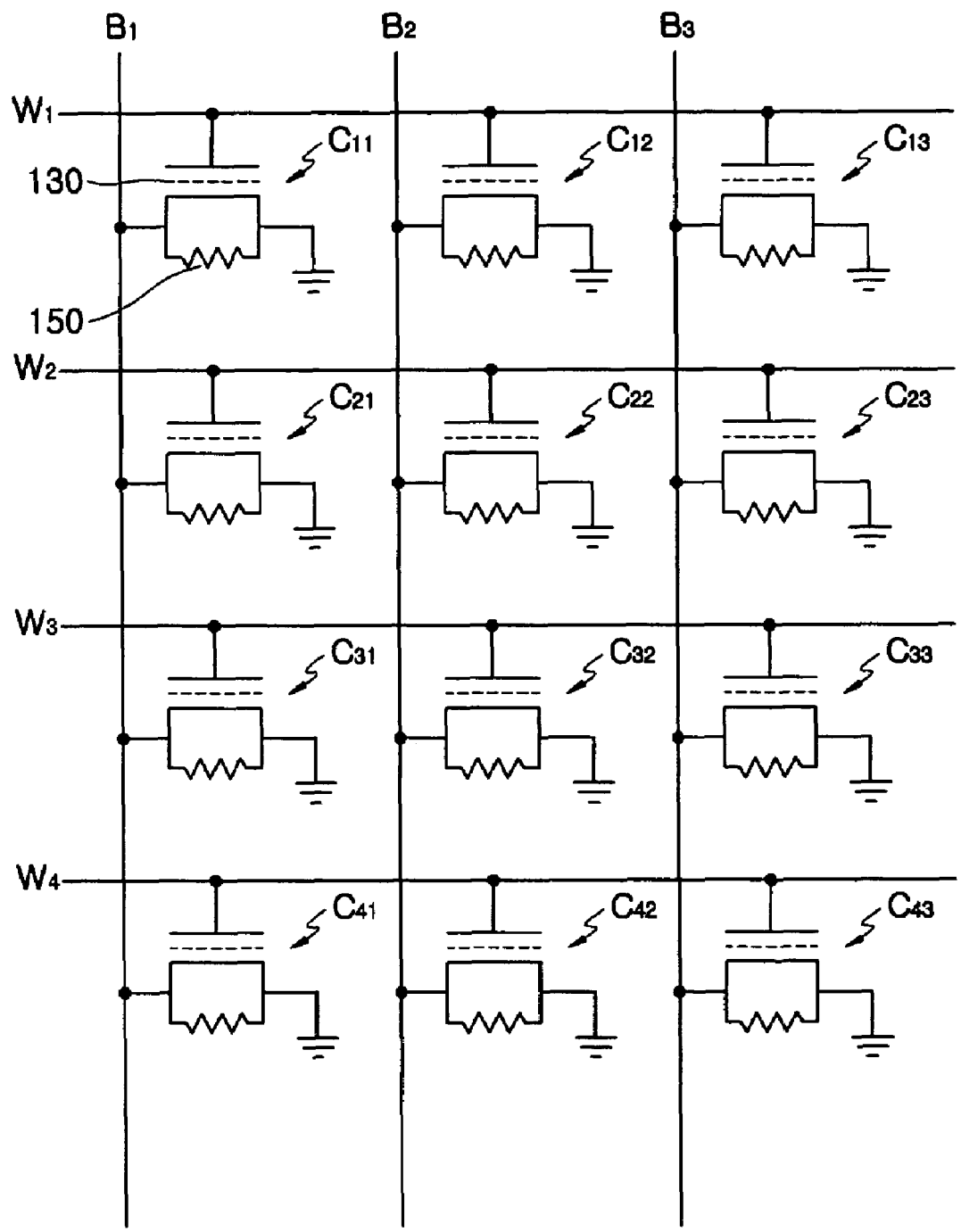
FIG. 1 is a schematic circuit diagram illustrating a memory device according to an example embodiment of the present invention.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

FIG. 1 is a schematic circuit diagram illustrating a NOR-type hybrid multi-bit non-volatile memory device according to an example embodiment of the present invention. As shown, a NOR cell array structure may include a plurality of unit cells $C_{11}$, $C_{12}$, $C_{13}$, $C_{21}$, $C_{22}$, $C_{23}$, $C_{31}$, $C_{32}$ and $C_{33}$. The plurality of unit cells $C_{11}$, $C_{12}$, $C_{13}$, $C_{21}$, $C_{22}$, $C_{23}$, $C_{31}$, $C_{32}$ and $C_{33}$ may be arranged in a matrix of rows and columns. Although FIG. 1 illustrates an example 4×3 unit cell, example embodiments of the present invention is not restricted thereto.

The matrix structure may comprise a plurality of word lines $W_1$, $W_2$, $W_3$ and $W_4$ arranged in rows, and a plurality of bit lines $B_1$, $B_2$ and $B_3$ arranged in columns. The unit cells $C_{11}$, $C_{12}$, $C_{13}$, $C_{21}$, $C_{22}$, $C_{23}$, $C_{31}$, $C_{32}$ and $C_{33}$ may be arranged inside the matrix of word lines and bit lines.

In the example shown in FIG. 1, the unit cell $C_{11}$ may be connected to the first word line $W_1$ and the first bit line $B_1$, and the unit cell $C_{21}$ may be connected to the second word line $W_2$ and the first bit line $B_1$. The unit cell numbers may correspond to the word line numbers and bit line numbers.

Each of the unit cells $C_{11}$, $C_{12}$, $C_{13}$, $C_{21}$, $C_{22}$, $C_{23}$, $C_{31}$, $C_{32}$ and $C_{33}$ may have the same, substantially the same, similar or substantially similar structure. For example, the unit cell $C_{11}$ may have a hybrid structure combining a first memory unit including a first storage node 130 with a second memory unit including a second storage node 150. The first memory unit and the second memory unit may share a source 115 and a drain 110. This example will be described in more detail with reference to FIG. 2.

The first memory unit of the unit cell $C_{11}$ may be connected to the first word line $W_1$, and the drain 110 shared by the first and second memory units may be connected to the first bit line $B_1$. The unit cells may be arranged in the same row, for example, the unit cells $C_{11}$, $C_{12}$ and $C_{13}$ arranged in a first row, may be commonly connected to the first word line $W_1$. For example, a control gate electrode 140 of the unit cell $C_{11}$ may be connected to the first word line $W_1$. This example will be described in more detail with reference to FIG. 2.

The unit cells may be arranged in the same column, for example, the unit cells $C_{11}$, $C_{21}$, $C_{31}$ and $C_{41}$ arranged on a first column, may be commonly connected to the first bit line $B_1$. Such a connection may be applied to the bit lines $B_2$ and $B_3$ and the word lines $W_2$, $W_3$ and $W_4$.

Figure 2:
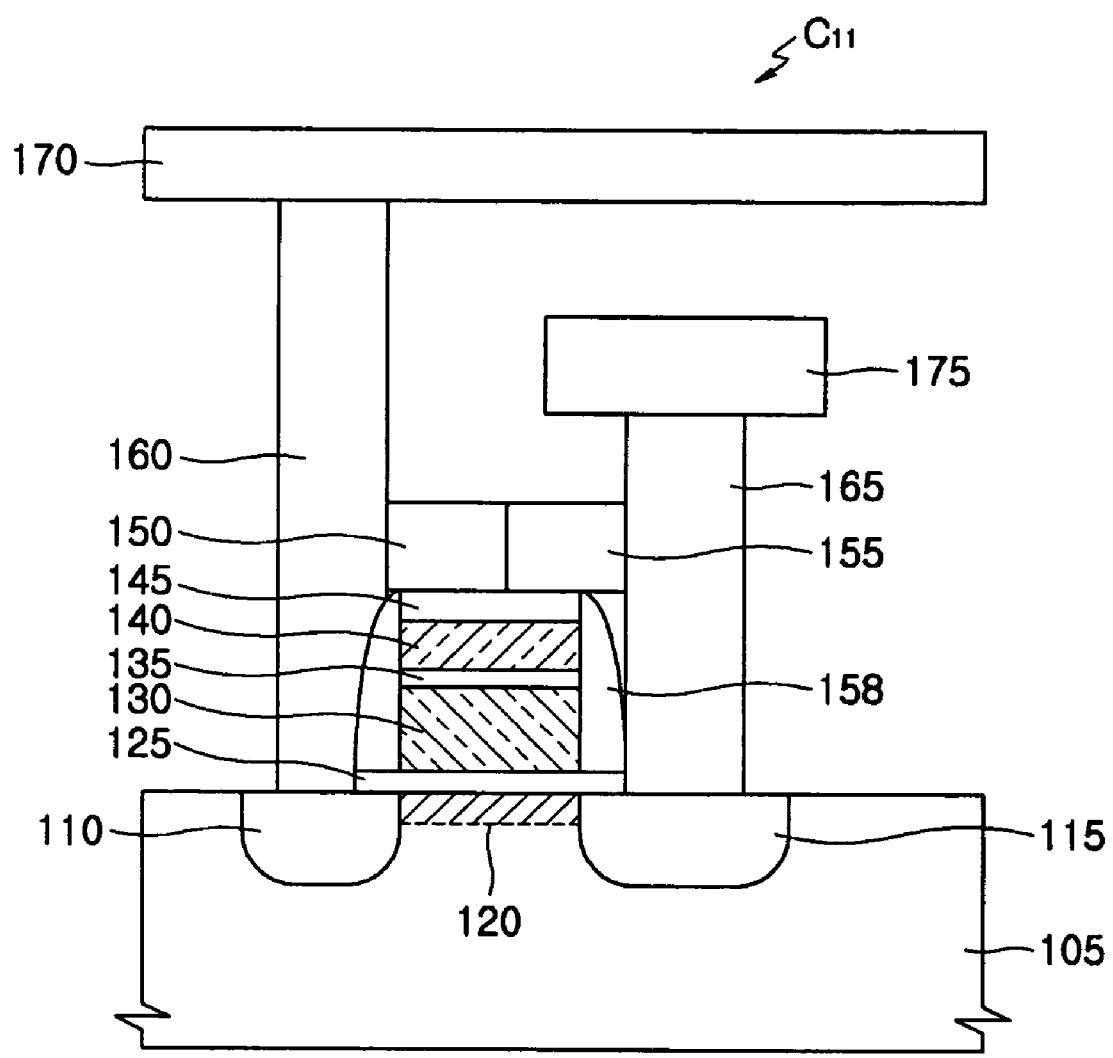
FIG. 2 is a cross-sectional view of a unit cell of the NOR-type hybrid multi-bit non-volatile memory device of FIG. 1.

FIG. 2 is a cross-sectional view of the unit cell $C_{11}$ of the NOR-type hybrid multi-bit non-volatile memory device of FIG. 1. As described above, because each of the unit cells $C_{11}$, $C_{12}$, $C_{13}$, $C_{21}$, $C_{22}$, $C_{23}$, $C_{31}$, $C_{32}$ and $C_{33}$ may have the same, substantially the same, similar or substantially similar structure, the unit cell $C_{11}$, is described for example purposes. The unit cell $C_{11}$ may use a different type of storage media for each of the first storage node 130 and the second storage node 150.

The first memory unit including the first storage node 130 may be formed in a gate stack structure. The first storage node 130 may be used as a storage medium of a threshold voltage transition memory device, for example, a flash memory, a SONOS memory or the like. The first storage node 130 may float between a channel 120 of a semiconductor substrate 105 and the control gate electrode 140.

For example, a first insulating layer 125 may be disposed between the channel 120 and the first storage node 130, and a second insulating layer 135 may be disposed between the first storage node 130 and the control gate electrode 140. A third insulating layer 145 may be formed on the control gate electrode 140. A fourth insulating layer 158 may be formed on gate stack sidewalls of the first storage node 130, the second insulating layer 135, the control gate electrode 140 and the third insulating layer 145.

The first storage node 130 may comprise, for example, polysilicon, silicon nitride, a silicon dot, a metal dot, or the like, in order to store charges. The first insulating layer 125 may comprise silicon oxide, silicon nitride, a higher dielectric insulating layer, or the like, each of which may be sufficiently thin to enable tunnelling of charges. The second insulating layer 135 may comprise silicon oxide, silicon nitride or the like. The control gate electrode 140 may comprise polysilicon, metal or metal silicide on the polysilicon, or the like. The third and fourth insulating layers 145 and 158 may be composed of silicon oxide, silicon nitride, silicon oxide/nitride or the like.

Each of the source 115 and the drain 110 may contact a respective side of the channel 120 of the semiconductor substrate 105. The source 115 and the drain 110 may form a diode structure with the semiconductor substrate 105. If the semiconductor substrate 105 is doped with a p-type impurity, the source 115 and the drain 110 may be doped with an n-type impurity. The doping of the semiconductor substrate 105, the source 115 and the drain 110 is interchangeable, however. For example, the semiconductor substrate 105 may be doped with an n-type impurity and the source 115 and the drain 110 may be doped with a p-type impurity.

The drain 110 may be connected to the first bit line $B_1$ as described with reference to FIG. 1. The drain 110 may be connected to the first bit line 170 via a first contact plug 160. The source 115 may be grounded through a connection to a ground wiring 175 via a second contact plug 165.

In this example, a circuit is formed between the drain 110 and the source 115 via the channel 120, and the control gate electrode 140 may control whether to electrically turn the channel 120 on or off. For example, if a voltage greater than a threshold voltage is applied to the control gate electrode 140, the channel 120 may be turned on. On the other hand, if a voltage less than a threshold voltage is applied to the control gate electrode 140, the channel 120 may be turned off.

The second storage node 150 may be connected in series to a switch 155. The second storage node 150 and the switch 155 may be connected to the source 115 or the drain 110, respectively. The second storage node 150 may be connected to the drain 110, and the switch 155 may be connected to the source 115, or vice versa.

For example, the second storage node 150 may be formed on the third insulating layer 145, and may be connected to the drain 110 via the first contact plug 160. The switch 155 may be formed on the third insulating layer 145, and may be connected to the source 115 via the second contact plug 165.

The second storage node 150 may be, for example, a variable resistance storage material whose resistance may vary in response to (or according to) an applied voltage. For example, the second storage node 150 may be composed of a material selected from a group consisting of $Nb_2O_5$, Cr doped $SrTiO_3$, $ZrO_x$, $GST(GeSb_xTe_y)$, NiO, $TiO_2$, HfO or the like. The switch 155 may be composed of transition metal oxide (TMO), for example, $V_2O_5$, TiO or the like, which is electrically conductive when (e.g., only when) a voltage greater than a critical voltage is applied to the switch 155.

Figure 3:
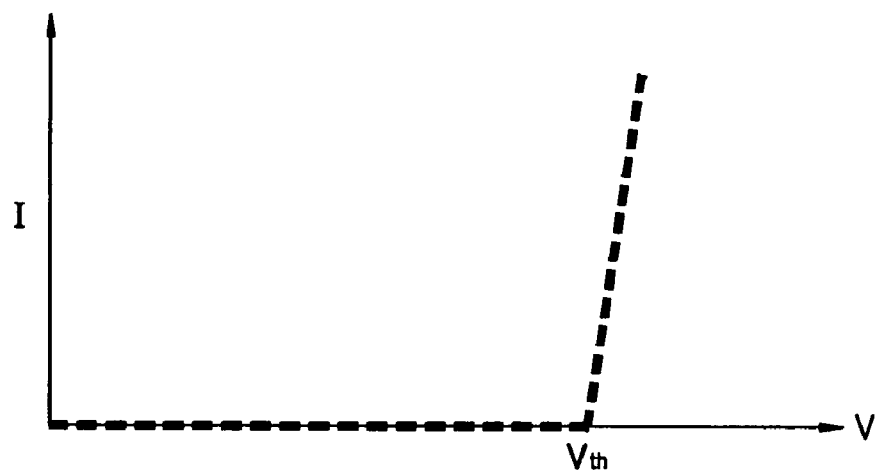
FIG. 3 is a graph illustrating a voltage versus a current characteristic of a switch of the unit cell of FIG. 2.

FIG. 3 is a graph illustrating a voltage versus a current characteristic of the switch 155 of the unit cell $C_{11}$, of FIG. 2. Referring to FIG. 3, if a voltage applied to both nodes of the switch 155 is less than a critical voltage $V_{th}$, current does not flow through the switch 155. If the voltage applied to both nodes of the switch 155 is greater than the critical voltage $V_{th}$, current increases, for example, rapidly. The switch 155 may be used as a rectifying diode, and/or may control current flowing to the second storage node 150.

The switch 155 may not be conductive (e.g., may be insulating) when a critical voltage is applied to both nodes, for example, until 1.5 Volts are applied thereto, for example, if the switch 155 is a $V_2O_5$ switch. In this example, a substantial portion (e.g., most, all or substantially all, etc.) voltage applied between the source 115 and the drain 110 may be applied to both nodes of the switch 155 with higher resistance.

If the voltage applied to both nodes of the switch 155 is greater than the critical voltage, the switch 155 may be converted into a conductor through which current may increasingly flow.

The voltage applied to the source 115 and the drain 110 may be distributed between the switch 155 and the second storage node 150 forming a new circuit in addition to the circuit between the source 115 and the drain 110 via the channel 120.

Figure 4:
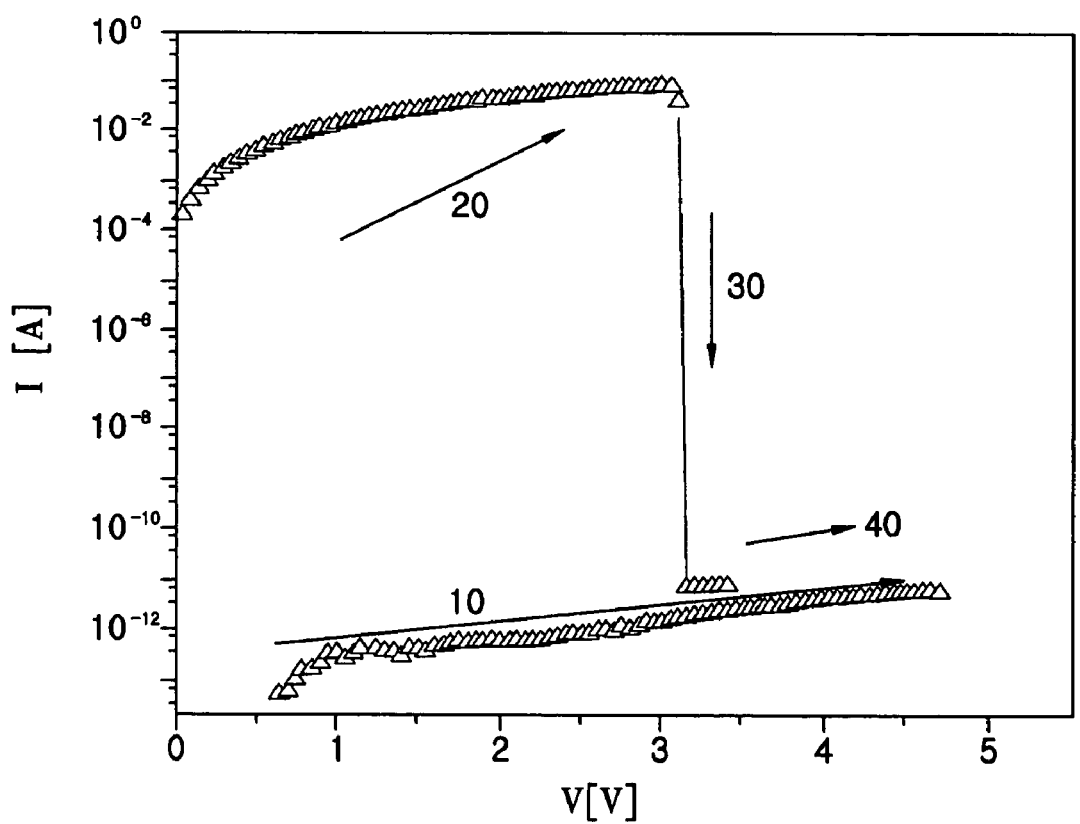
FIG. 4 is a graph illustrating a voltage versus a current characteristic of a second storage node of the unit cell of FIG. 2.

FIG. 4 is a graph illustrating a voltage versus a current characteristic of the second storage node 150 of the unit cell $C_{11}$, of FIG. 2. In one example, as shown in FIG. 4, the second storage node 150 may be composed of NiO. In example embodiments of the present invention, the graph may depend on the variable resistance storage material.

If an initial voltage is applied to the second storage node 150 composed of NiO (path 10), current does not flow through the second storage node 150 until the applied voltage reaches a critical voltage, for example, 4.5 V for NiO. In this example, the second storage node 150 has a higher resistance value (e.g., a reset state). If a voltage greater than the critical voltage is applied to the second storage node 150, current increases, for example, rapidly. After the voltage applied to the the second storage node 150 reaches and exceeds the critical voltage, if a voltage of zero is again applied to the second storage node 150 (path 20), higher current may flow through the second storage node 150. In this example, the second storage node 150 has a lower resistance value (e.g., a set state). If a voltage greater than the reset voltage is applied to the second storage node 150, current may decrease, for example, rapidly (path 30). For example, the second storage node 150 may return a higher resistance value of the reset state. As the voltage applied to the second storage node 150 (path 40) increases, the path may be the same or substantially the same as the path of the reset state.

The second storage node 150 may be changed to have a different resistivity when the critical voltage or the reset voltage is applied. Such a change may be maintained within the voltage range even after the applied voltage is removed. In this example, the second storage node 150 may be used as a storage medium of an NVM device.

A method of operating the NOR-type hybrid multi-bit non-volatile memory device will now be described with reference to FIG. 1. The unit cells $C_{11}, C_{12}, C_{13}, C_{21}, C_{22}, C_{23}, C_{31}, C_{32}$ and/or $C_{33}$, which may be arranged in the matrix, may be accessed by selecting the word lines $W_1$, $W_2$, $W_3$ and/or $W_4$ and the bit lines $B_1$, $B_2$ and/or $B_3$.

In order to select the unit cell $C_{11}$, the first word line $W_1$ and the first bit line $B_1$. may be selected to apply operating power, for example, an operating voltage, thereto. For example, a first voltage may be applied to the first word line $W_1$, and a second voltage may be applied to the first bit line $B_1$. The other unit cells may be selected in the same or substantially the same manner. In this example, the other word lines $W_2$, $W_3$ and/or $W_4$ and bit lines $B_2$ and $B_3$ may be floated or a zero voltage may be applied thereto.

A method of operating a unit cell according to an example embodiment of the present invention will now be described with reference to FIGS. 5 and 6.

Figure 5:
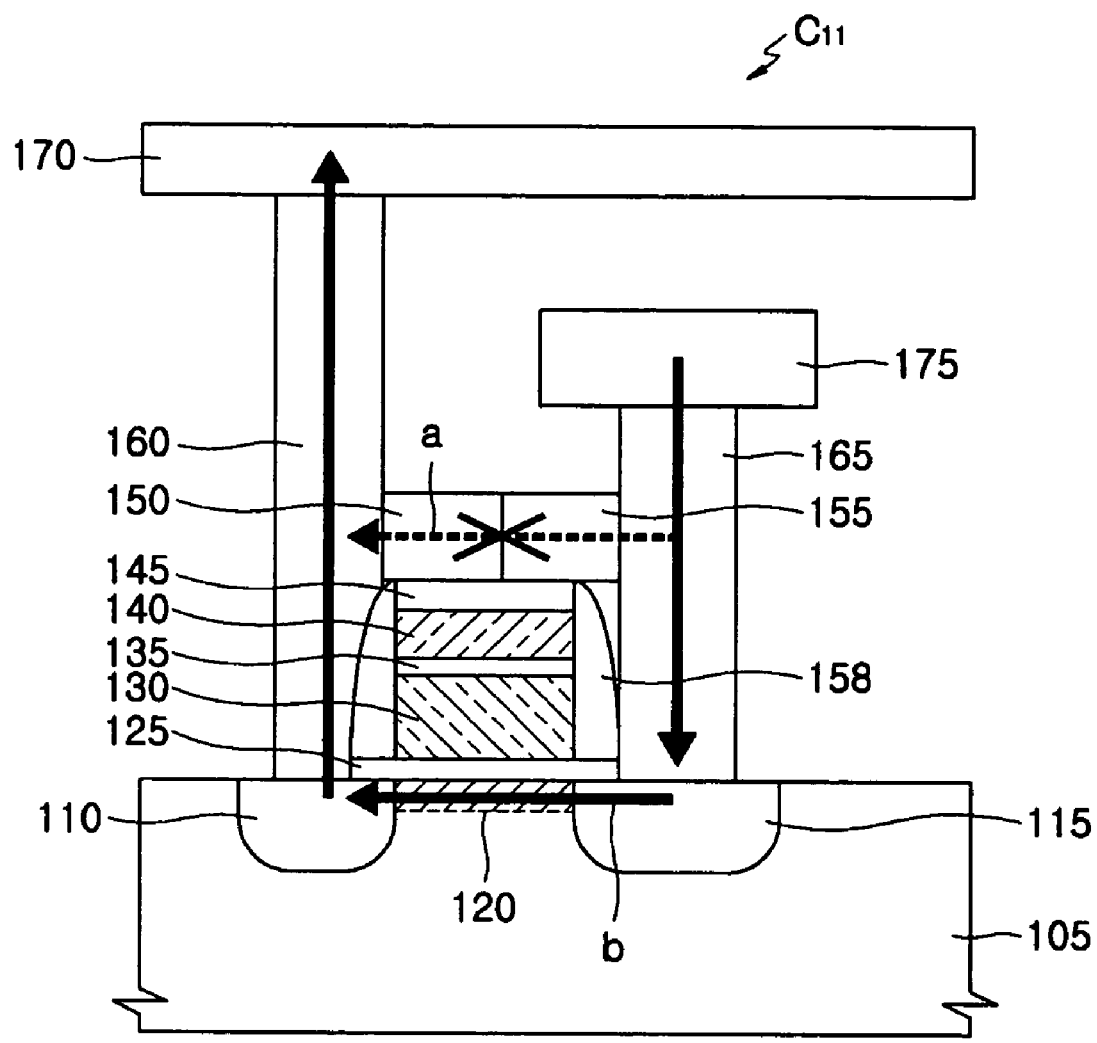
FIG. 5 is a cross-sectional view of the unit cell of FIG. 2 illustrating a selective operation of a first memory unit of the unit cell of FIG. 2.

FIG. 5 is a cross-sectional view of the unit cell of FIG. 2 illustrating a selective operation of the first memory unit of the unit cell $C_{11}$. Referring to FIG. 5, a first voltage applied to the first word line $W_1$, for example, a voltage applied between the control gate electrode 140 and the channel 120, may be increased above the threshold voltage to turn the channel 120 on. The second voltage applied to the drain 110 via the first bit line 170 may be lowered to less than the critical voltage and applied to the switch 155.

In this example, electrons (current) may not flow through a circuit a between the source 115 and the drain 110 via the switch 155 and the second storage node 150. Instead, current may flow through a circuit b between the source 115 and the drain 110 via the channel 120. The channel may be turned on, whereas the switch 155 may be turned off. Electrons may flow in the direction of the arrows, whereas current flows in the opposition direction of the arrows.

The write operation for the first storage node 130 may be performed by lowering a second voltage applied to the drain 110 to less than the critical voltage, and setting the first voltage applied to the control gate electrode 140 as a write voltage. The write voltage may be a voltage greater than the threshold voltage applied to the channel 120.

Electron or current may not flow through the circuit via the switch 155 but may flow through the circuit b via the channel 120. Charge may be stored in the first storage node 130 by tunneling from the channel 120 via the first insulating layer 125 and/or hot carriers injection. When the electrons are stored in the first storage node 130, the threshold voltage of the p-type channel 120 may be increased.

The erase operation for the first storage node 130 may be performed by setting the first voltage applied to the control gate electrode 140 as an erase voltage. For example, the electrons of the first storage node 130 may be moved by applying a negative voltage to the control gate electrode 140. The electron stored in the first storage node 130 may be erased to the channel 120 by tunneling of charges. The threshold voltage of the channel 120 may be lowered to an initial state before a write operation is performed.

The read operation for the first storage node 130 may be performed by lowering the second voltage applied to the drain 110 to less than the critical voltage, and setting the first voltage applied to the control gate electrode 140 as a read voltage. The read voltage may be determined on the basis of the threshold voltage of the channel 120 in the write and erase states.

For example, the read voltage may be selected to turn the channel 120 off in the write state turn the channel 120 on in the erase state. Current may not flow through the channel 120 in the write state, and current may flow through the channel 120 in the erase state. The read operation may sense current that flows through the channel 120 and may recognize the write state and/or the erase state.

Figure 6:
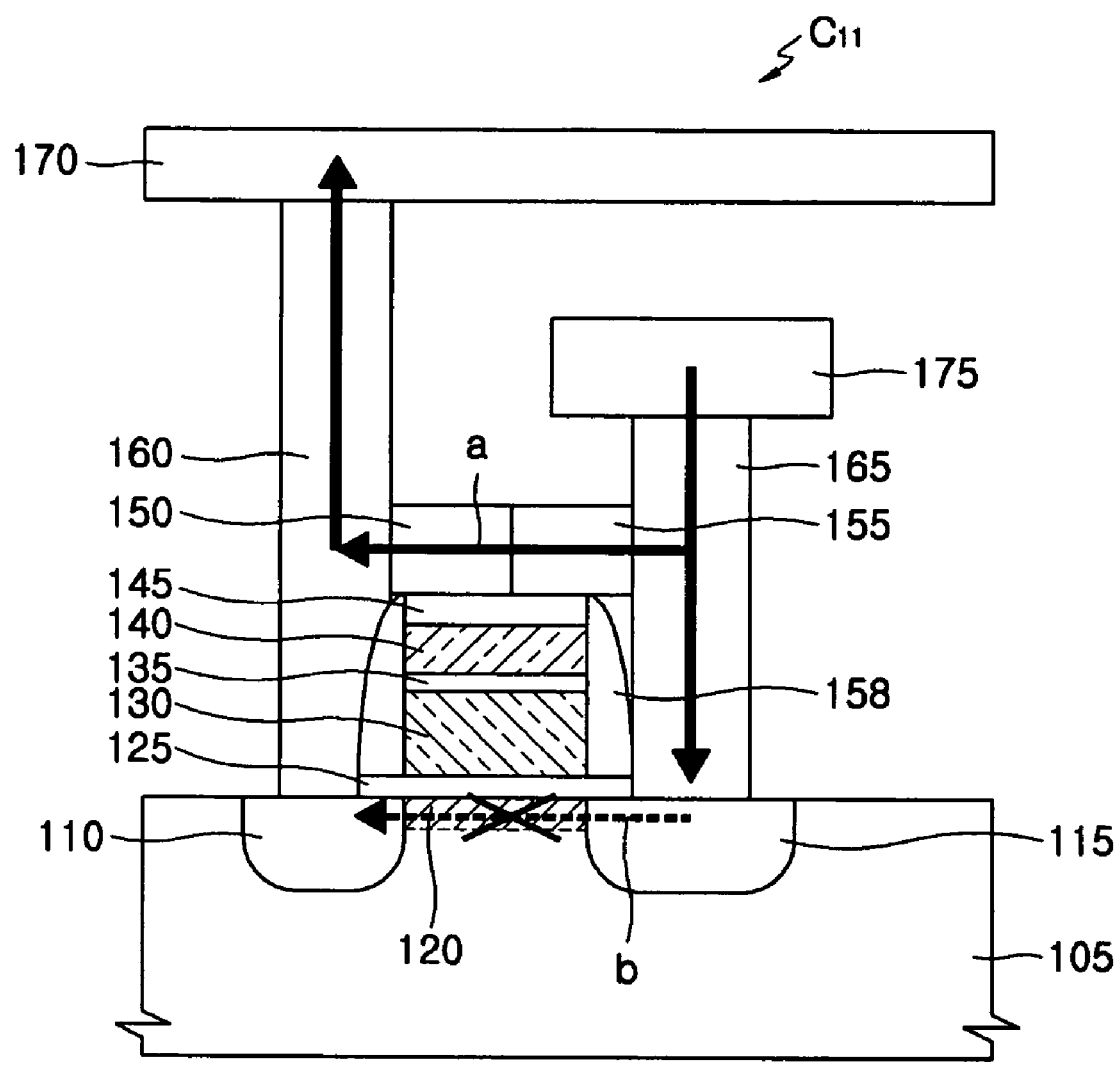
FIG. 6 is a cross-sectional view of the unit cell of FIG. 2 illustrating a selective operation of a second memory unit of the unit cell of FIG. 2.

FIG. 6 is a cross-sectional view of the unit cell of FIG. 2 illustrating a selective operation of the second memory unit of the unit cell $C_{11}$. A selective operation of the second storage node 150 will now be described with reference to FIG. 6.

Referring to FIG. 6, a voltage applied to the first word line $W_1$, for example, a voltage applied between the control gate electrode 140 and the channel 120, may be lowered to less than or equal to the threshold voltage (e.g., zero Volts) turning the channel 120 off. The voltage applied to the drain 110 via the first bit line 170 may be increased above the critical voltage and applied to the switch 155.

As a result, electrons and/or current may not flow through circuit b between the source 115 and the drain 110 via the channel 120. Instead, electrons, and/or may flow through a circuit a between the source 115 and the drain 110 via the switch 155 and the second storage node 150. For example, the channel 120 may be turned off, whereas the switch 155 may be turned on.

The write operation for the second storage node 150 may be performed by setting the second voltage applied to the drain 110 as a write voltage, and lowering the first voltage applied to the control gate electrode 140 to less than the threshold voltage. The write voltage may be a critical voltage greater than about 4.5 Volts. This may lower the resistance of the second storage node 150, when the second storage node 150 is composed of, for example, NiO.

Electrons and/or current may not flow through circuit b via the channel 120, but may flow through the circuit via the switch 155. As described with reference to FIG. 4, the second storage node 150 may be in the set state and thus may have voltage-current characteristics which are the same or substantially the same as path 20. For example, the second storage node may have lower resistance characteristics.

The erase operation for the second storage node 150 may be performed by setting the second voltage applied to the drain 110 at an erase voltage, and lowering the first voltage applied to the control gate electrode 140 to less than the threshold voltage. The erase voltage may be the voltage of path 30 illustrated in FIG. 4. The second storage node 150 may be in a reset state, and may have higher resistance characteristics.

The read operation for the second storage node 150 may be performed by setting the second voltage applied to the drain 110 as a read voltage, and lowering the first voltage applied to the control gate electrode 140 to less than the threshold voltage. The read voltage may be a voltage less than the write voltage and/or the erase voltage. The read operation may sense current flowing through the second storage node 150. For example, path 20 illustrated in FIG. 4 corresponds to a write state, and path 10 illustrated in FIG. 4 corresponds to an erase state.

The unit cell $C_{11}$ is a hybrid combination of a multi-bit memory using the first storage node 130 capable of storing charges, and a multi-bit memory using the second storage node 150. Memory devices, according to example embodiments of the present invention, in which the unit cell $C_{11}$, has a NOR cell array structure may perform a multi-bit operation of each of the unit cells $C_{11}$, $C_{12}$, $C_{13}$, $C_{21}$, $C_{22}$, $C_{23}$, $C_{31}$, $C_{32}$ and/or $C_{33}$.

In example embodiments of the present invention, the second storage node 150 may be comprised of a phase change material film. The phase change material film may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase change material film may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the phase change material film may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the phase change material film is described above as being formed primarily of ternary phase-change chalcogenide alloys, the chalcogenide alloy of the phase change material could be selected from a binary phase-change chalcogenide alloy or a quaternary phase-change chalcogenide alloy. Example binary phase-change chalcogenide alloys may include one or more of Ga—Sb, In—Sb, In—Se, Sb2-Te3 or Ge—Te alloys; example quaternary phase-change chalcogenide alloys may include one or more of an Ag—In—Sb—Te, (Ge—Sn)—Sb—Te, Ge—Sb—(Se—Te) or Te81-Ge15-Sb2-S2 alloy, for example.

In an example embodiment, the phase change material film may be made of a transition metal oxide having multiple resistance states, as described above. For example, the phase change material may be made of at least one material selected from the group consisting of NiO, TiO2, HfO, Nb2O5, ZnO, WO3, and CoO or GST (Ge2Sb2Te5) or PCMO(PrxCa1-xMnO3). The phase change material film may be a chemical compound including one or more elements selected from the group consisting of S, Se, Te, As, Sb, Ge, Sn, In and Ag.

The NOR-type hybrid multi-bit NVM devices according to example embodiments of the present invention may increase memory capacity and/or speed.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A memory device comprising:
 a plurality of unit cells arranged in a matrix of a plurality of rows and a plurality of columns, each unit cell including,
  a channel,
  a first memory unit including a first storage node for storing charges, and being adapted to read data based on changes in a threshold voltage of the channel,
  a second memory unit including a second storage node having a resistance characteristics that vary according to an applied voltage, and
  a switch connected only to the second storage node; wherein
   the first memory unit and the second memory unit share a source and a drain,
   the first memory unit of the unit cells arranged in one of the plurality of rows are commonly connected to one of a plurality of word lines, and the drain of the unit cells arranged in one of the plurality of columns are commonly connected to one of a plurality of bit lines, and
   the memory device has a NOR cell array structure.

2. The memory device of claim 1, wherein each first storage node comprises poly silicon, silicon nitride, a silicon dot or a metal dot.

3. The memory device of claim 1, wherein each second storage node is a variable resistance storage material that varies according to an applied voltage.

4. The memory device of claim 1, wherein each second storage node comprises $Nb_2O_5$, Cr doped $SrTiO_3$, $ZrO_x$, GST ($GeSb_xTe_y$), NiO, $TiO_2$ or HfO.

5. The memory device of claim 1, wherein each switch is comprised of a material that is electrically conductive only when a voltage greater than a critical voltage is applied.

6. The memory device of claim 1, wherein the switch is composed of a transition metal oxide (TMO).

7. The memory device of claim 1, wherein the transition metal oxide (TMO) is comprised of $V_2O_5$ or TiO.

8. The memory device of claim 1, wherein the source and the drain are connected to the channel and the second storage node in parallel.

9. The memory device of claim 1, wherein each of the unit cells further includes,
 a metal line connecting the second storage node and the switch to the source or the drain.

10. The memory device of claim 1, wherein the source of each unit cell is grounded.

11. A method of operating the memory device of claim 1, the method comprising:
 selecting one of the unit cells by selecting one of the word lines and one of the bit lines;
 controlling the first memory unit of the selected unit cell by controlling a first voltage applied to the word line connected to the selected unit cell and inducing a current flow through the channel of the first memory unit in the selected unit cell; and
 controlling the second memory unit of the selected cell by controlling a second voltage applied to the bit line connected to the selected unit cell and inducing a current flow through the switch of the second memory unit in the selected unit cell.

12. The method of claim 11, wherein a write operation for the first memory unit of the selected unit cell is performed by,
 preventing current flow through the switch of the selected unit cell by reducing the second voltage to a value less than a critical voltage,
 setting the first voltage as a write voltage, and
 storing charge in the first storage node of the selected unit cell.

13. The method of claim 11, wherein a write operation for the second memory unit of the selected unit cell is performed by,
 preventing current flow through the channel of the selected unit cell by reducing the first voltage to a value less than a threshold voltage,
 allowing current to flow through the switch of the selected unit cell by setting the second voltage to a write voltage that is greater than the critical voltage, and
 inducing resistance variation of the second storage node of the selected unit cell.

14. The method of claim 11, wherein an erase operation for the first memory unit of the selected unit cell is performed by,
 preventing current flow through the switch of the selected unit cell by reducing the second voltage to a value less than the critical voltage,
 setting the first voltage to an erase voltage, and
 storing charge in the first storage node of the selected unit cell.

15. The method of claim 11, wherein an erase operation for the second memory unit of the selected unit cell is performed by,
   preventing current flow through the channel of the selected unit cell by lowering the first voltage to a value less than the threshold voltage,
   setting the second voltage to an erase voltage, and
   inducing resistance variation of the second storage node of the selected unit cell.

16. The method of claim 11, wherein a read operation for the first memory unit of the selected unit cell is performed by,
   preventing current flow through the switch of the selected unit cell by reducing the second voltage to a value less than the critical voltage,
   setting the first voltage to a read voltage, and
   measuring the threshold voltage of the channel of the selected unit cell based on whether charge is stored in the first storage node of the selected unit cell.

17. The method of claim 11, wherein a read operation for the second memory unit of the selected unit cell is performed by,
   preventing current flow through the channel of the selected unit cell by lowering the first voltage to a value less than the critical voltage,
   setting the second voltage to a read voltage, and
   measuring current flowing between the source and the drain of the selected unit cell according to resistance variation of the second storage node of the selected unit cell.

18. A memory device, comprising:
   a plurality of unit cells arranged in a matrix of a plurality of rows and a plurality of columns, each unit cell including,
      a channel,
      a first memory unit including a first storage node for storing charges, and being adapted to read data based on changes in a threshold voltage of the channel,
      a second memory unit including a second storage node having a resistance characteristics that vary according to an applied voltage, and
      a switch connected to the second storage node;
   wherein the first memory unit and the second memory unit share a source and a drain,
   the first memory unit of the unit cells arranged in one of the plurality of rows are commonly connected to one of a plurality of word lines, and the drain of the unit cells arranged in one of the plurality of columns are commonly connected to one of a plurality of bit lines, and
   the memory device has a NOR cell array structure; and
   wherein in each unit cell,
      the channel is formed on a semiconductor substrate,
      the source and the drain are formed adjacent to both ends of the channel,
      a first insulating layer is formed on the channel,
      the first storage node is a charge storage medium formed on the first insulating layer,
      a second insulating layer is formed on the first storage node,
      a control gate electrode is formed on the second insulating layer,
      a third insulating layer is formed on the control gate electrode,
      the second storage node is a variable resistance medium formed on the third insulating layer, and
      the control gate electrode of the unit cells in one of the plurality of rows commonly connects the first memory units of the unit cells to one of the plurality of wordlines.

19. The memory device of claim 18, wherein the first storage node comprises poly silicon, silicon nitride, a silicon dot, or a metal dot.

20. The memory device of claim 18, wherein the second storage node is a variable resistance storage material having a resistance that varies according to an applied voltage.

21. The memory device of claim 18, wherein the second storage node is comprised $Nb_2O_5$, Cr doped $SrTiO_3$, $ZrO_x$, $GST(GeSb_xTe_y)$, NiO, $TiO_2$ or HfO.

22. The memory device of claim 18, wherein the switch is comprised of a material which is electrically conductive only when a voltage greater than a critical voltage is applied.

23. The memory device of claim 18, wherein the switch is composed of $V_2O_5$ or TiO.

* * * * *

UNITED STATES PATENT AND TRADEMARK OFFICE
CERTIFICATE OF CORRECTION

PATENT NO. : 7,492,635 B2
APPLICATION NO. : 11/371941
DATED : February 17, 2009
INVENTOR(S) : Won-joo Kim and Yoon-dong Park It is certified that error appears in the above-identified patent and that said Letters Patent is hereby corrected as shown below:

On the Title Page should read

Item (73) Assignee: Samsung Electronics Co., Ltd.,

Gyeonggi-do (KR)

Signed and Sealed this

Thirty-first Day of March, 2009

JOHN DOLL
*Acting Director of the United States Patent and Trademark Office*